US006260173B1

(12) United States Patent
Weng et al.

(10) Patent No.: US 6,260,173 B1
(45) Date of Patent: Jul. 10, 2001

(54) COMBINED SYSTEM FOR PRODUCING ERROR CORRECTION CODE SYMBOLS AND ERROR SYNDROMES

(76) Inventors: Lih-Jyh Weng, 95 Brookdale Circle; Ba-Zhong Shen, 50 Commons Drive, #211, both of Shrewsbury, MA (US) 01545; Shih Mo, 548 Wool Drive, Milpitas, CA (US) 95035; Chung-Hsing Chang, 3254 Cropley Avenue, San Jose, CA (US) 95132

( * ) Notice: Subject to any disclaimer, the term of this patent is extended or adjusted under 35 U.S.C. 154(b) by 0 days.

(21) Appl. No.: 09/219,472

(22) Filed: Dec. 23, 1998

(51) Int. Cl.[7] .................................................. H03M 13/00
(52) U.S. Cl. ........................ 714/781; 714/784; 714/785; 708/492
(58) Field of Search ..................................... 714/781, 784, 714/785, 763, 798, 752, 756, 762; 708/492

(56) References Cited

U.S. PATENT DOCUMENTS

| 5,778,009 | * | 7/1998 | Fredickson et al. | 714/752 |
| 5,887,006 | * | 3/1999 | Sharma | 714/784 |
| 5,901,158 | * | 7/1998 | Weng et al. | 714/785 |

OTHER PUBLICATIONS

Fettweis et al., A Combined Reed–Solomon Encoder and Syndrome Generator with Small Hardware Complexity, IEEE pp. 1871–1874.*

* cited by examiner

Primary Examiner—Emmanuel L. Moise
(74) Attorney, Agent, or Firm—Cesari & McKenna

(57) ABSTRACT

A combined encoding/syndrome generating circuit is segmented into multiple-cell blocks that operate in parallel during encoding operations to produce interim sums. The interim sums are then combined to propagate a sum across the system, from the first cell to the last cell. Each cell includes a Galois Field multiplier and an associated update adder and register. A block of two cells includes two sets of associated Galois Field multipliers, registers and update adders, and a block feedback adder that produces the associated interim sum by adding together the products produced in parallel by each of the cells. A block with more than two cells includes additional feedback adders that operate in parallel to selectively combine the products produced by the plurality of cells, and produce an interim sum that includes a contribution from each of the cells in the block. The system then adds together the interim sums produced simultaneously by the various blocks, to propagate a sum across the system. Also, the interim sum from a given block is combined in parallel into the products produced by the respective cells of the next block, to include in the update signals that are fed back to the associated registers the contributions from each of the previous cells. During syndrome generation operations, the cells essentially operate independently to produce the syndromes. The current system includes more feedback adders than the conventional Fettweis-Hassner circuit, however, the delay through the current system is reduced from that of the conventional system, since many of the feedback adders in the current system operate in parallel.

15 Claims, 4 Drawing Sheets

COMBINED SYSTEM FOR PRODUCING ERROR CORRECTION CODE SYMBOLS AND ERROR SYNDROMES

FIELD OF INVENTION

The invention relates generally to error correction systems and, more particularly, to systems that use hardware that both encodes the data and produces associated error syndromes.

BACKGROUND OF THE INVENTION

Encoders for encoding data in accordance with a Reed-Solomon error correction code ("ECC") to produce ECC symbols are well known. A conventional encoder that produces "j" ECC symbols includes j Galois Field multipliers. The Galois Field multipliers are associated, respectively, with the j coefficients of the code generator polynomial, g(x). The encoder also includes feedback adders that combine the products associated with a given data symbol with the results of the encoding of the previous data symbol, and j registers that hold the sums produced by the adders. At the end of the encoding, the j registers contain the ECC symbols.

When a data symbol is supplied to the encoder the symbol is combined with the contents of a last register and the result is supplied to the Galois Field multipliers, which simultaneously multiply the results by the coefficients of g(x). The product produced by a first Galois Field multiplier updates the firt register. The products produced by the remaining Galois Field multipliers are combined, respectively, with the contents of the remaining registers and the results are used to update these registers. The last register is thus updated with the sum of (i) the product produced by the last Galois Field multiplier and (ii) the contents of the preceding register.

The updated contents of the last register are then combined with the next data symbol and the result is fed back to the Galois Field multipliers, with the remaining feedback adders adding the products produced by the multipliers to the results of the encoding of the previous data symbol and supplying the sums to update the registers, and so forth. As soon as the last data symbol is encoded, the ECC symbols are read from or clocked out of the j registers and concatenated with the data symbols to produce a data codeword that is transmitted or stored, as appropriate.

With such an encoder the latency is the time associated with a single feedback adder, since the adders operate in parallel to produce the updated sums for the registers. Accordingly, the latency is essentially non-existent As part of a decoding operation a decoding system manipulates the data symbols of a data code word to produce error syndromes that are then used to locate errors in the data. A conventional error syndrome generator includes j sets of associated update adders, Galois Field multipliers and registers, with each set operating simultaneously and essentially separately to produce the associated error syndrome.

Each update adder adds the product produced by the associated Galois Field multiplier to the next data symbol, and updates the associated register with the sum. Each Galois Field multiplier then multiplies the contents of the register by a coefficient of an error syndrome generator polynomial that is associated with the ECC and supplies the product to the associated update adder. The update adder adds the product to the next data symbol, and supplies the sum to the associated register, and so forth. After the last data symbol is supplied to the syndrome generator and added to the products produced by the respective Galois Field multipliers to update the registers, the j registers contain the j error syndromes.

The Galois Field multipliers that are included in the encoder and the syndrome generator are relatively complex components. An article by Gerhard Fettweis and Martin Hassner, *A Combined Reed-Solomon Encoder And Syndrome Generator With Small Hardware Complexity*, published by IEEE in 1992 describes hardware that uses the same Galois Field multipliers for both the encoding and the syndrome generation. The combined hardware thus uses one-half the number of multipliers that are required for separate encoder and syndrome generator hardware. The article is incorporated herein by reference.

The combined hardware described in the article includes j sets of associated registers, Galois Field multipliers, update adders and feedback adders. The j registers hold updated sums produced by the j associated update adders. Each Galois Field multiplier multiplies the contents of the associated register by a root of the generator polynomial and supplies the product to the associated feedback adder. During encoding operations, an associated AND gate passes to the adder the sum produced by the previous feedback adder. The adder then adds the propagating sum to the product and passes the result both to the associated update adder and through a next AND gate to the next feedback adder. The next feedback adder adds the propagating sum to the product produced by the associated multiplier, and the result is supplied to the associated update adder and through the next AND gate to a next feedback adder, and so forth. The feedback adders and the associated AND gates thus form a feedback path in which the adders operate as a chain.

During syndrome generation operations, the AND gates essentially break the chain of adders by blocking the propagation of a sum from one feedback adder to the next, and the j sets of associated registers, multipliers and adders operate separately to produce the j error syndromes.

With the combined hardware there is a latency in the encoding operations that corresponds to the time it takes the propagating sum to pass through the chain of j feedback adders. If the chain of adders is long, it restricts the speed with which the data can be encoded since the sum must propagate through the entire adder chain during a clock cycle. Accordingly, the system can not be clocked at a rate that exceeds the associated latency.

SUMMARY OF THE INVENTION

The invention is a combined encoding/syndrome generating circuit that is segmented into multiple-cell blocks that operate in parallel during encoding operations to produce interim sums. The interim sums are then combined to propagate a sum across the system, from the first cell to the last cell. The latency associated with propagating the sum across the system during encoding is thus reduced from the time associated with propagating a sum through a chain of j−1 adders to essentially the time associated with propagating a sum through $\log_2 j$ adders.

More specifically, each cell includes a Galois Field multiplier and an associated update adder and register. A block of two cells includes two sets of associated Galois Field multipliers, registers and update adders, and a block feedback adder that produces the associated interim sum by adding together the products produced in parallel by each of the cells. A block with more taan two cells includes additional feedback adders that operate in parallel to selectively combine the products produced by the plurality of cells, to produce, with minimal delay, an interim sum that includes a contribution from each of the cells in the block. The system then adds together the interim sums produced simultaneously by the various blocks, to propagate a sum across the system. Also, the interim sum from a given block is combined in parallel into the products produced by the respective cells of the next block, to include in the update signals that are fed back to the associated registers the contributions from each of the previous cells.

During syndrome generation operations, the cells essentially operate independently to produce the syndromes.

The current system includes more feedback adders than the conventional Fettweis-Hassner circuit, since the adders are required during encoding to (a) produce the interim sums, (b) combine the sums into the propagating sum, and (c) add the interim sums into the cells in an adjacent block. However, the delay through the current system is reduced from that of the conventional system, since many of the feedback adders in the current system operate in parallel.

BRIEF DESCRIPTION OF THE DRAWINGS

The invention description below refers to the accompanying drawings, of which.

DETAILED DESCRIPTION OF AN ILLUSTRATIVE EMBODIMENT

We discuss below the encoding operations of a conventional Fettweis-Hassner system and thereafter the encoding operations of an encoding/syndrome generating system that produces the error correction symbols with less latency than the Fettweis-Hassner system.

Figure 1:
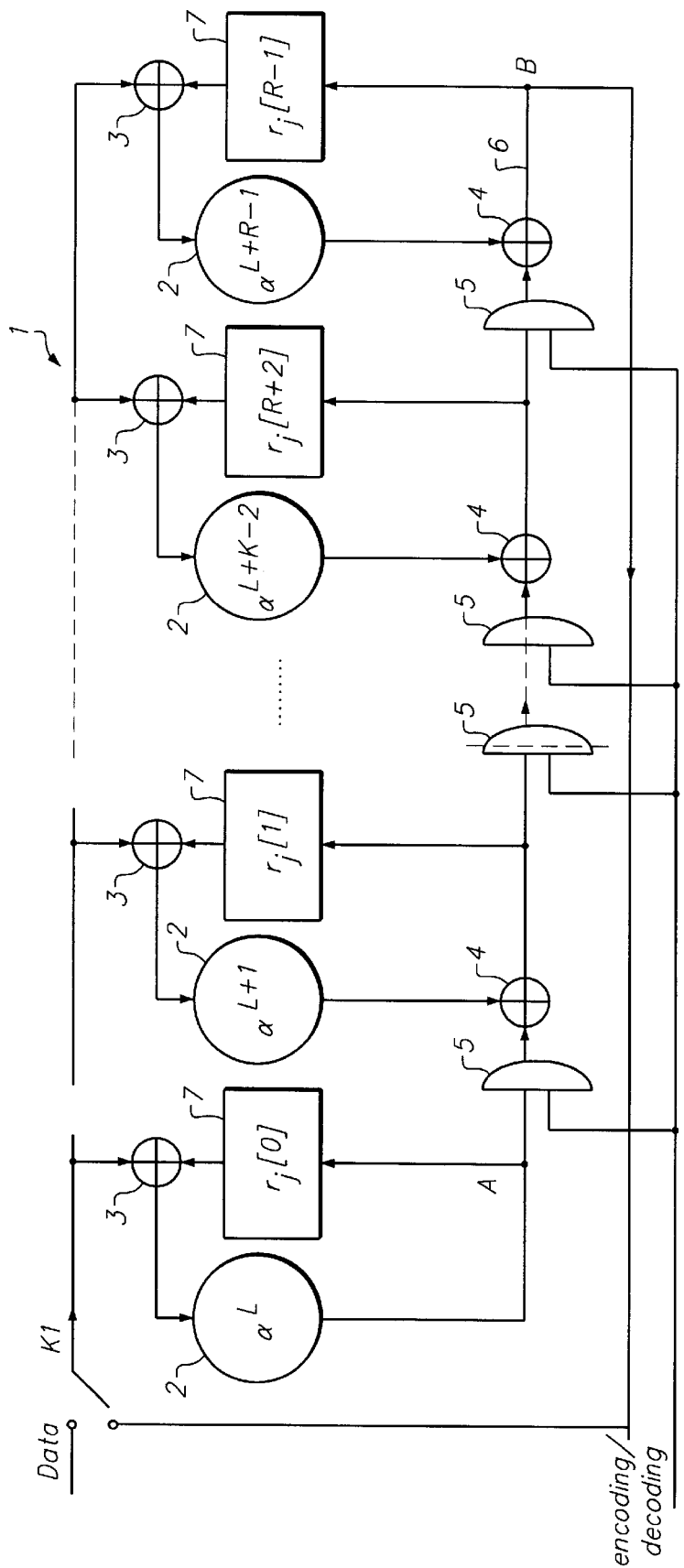
FIG. 1 is a finctional block diagram of a conventional Fettweis-Hassner circuit.

As depicted in FIG. 1, the conventional Fettweis-Hassner circuit 1 propagates a sum across a feedback path 6 by including in the sum the products produced by the respective Galois Field multipliers 2. Each Galois Field multiplier 2 multiplies the sum produced by an associated update adder 3 by a root of the generator polynomial, $g(x)=(x+a^0)(x+a^1)(x+a^2)\ldots(x+a^{j-1})$. An associated feedback adder 4 combines the product into the propagating sum, and an AND gate 5 passes the sum along the feedback path 6. The sum produced by the feedback adder 4 also updates an associated register 7. In a next clock cycle, the contents of the register 7 are combined with the next data symbol in the associated update adder 3. During the $n^{th}$ clock cycle, that is, when the $n^{th}$ data symbol is supplied to the system, the propagating sum produced by the $i^{th}$ feedback adder 4 is:

$$y_{n,i}=y_{n,i-1}+a^{i*}(r_{n-1,i}+d_n). \qquad \text{eqn. 1}$$

wherein $r_{n-1,i}$ represents the contents of the $i^{th}$ register 7 and $d_n$ is the $n^{th}$ data symbol. The register 7 contains the propagating sum produced during the previous clock cycle, and eqn. 1 becomes $$y_{n,i}=y_{n,1-j}+a^{i*}(y_{n-1,i}+d_n). \qquad \text{eqn. 2}$$

With $i \geq 0$ and $y_{n,-1}=0$, the propagating sum is thus:

$$y_{n,i} = \sum_{k=0}^{1} a^k * (y_{n-1,k} + d_n) \qquad \text{eqn. 3}$$

The propagating sum includes the products produced by all of the previous multipliers. Accordingly, the associated latency is essentially the time it takes the sum to pass along the feedback path 6, through the j−1 feedback adders 4. Each adder is implemented as an XOR gate, and a clock cycle must thus be at least as long as the delay through the chain of j−1 XOR gates.

A. Encoding Operations

Figure 4:
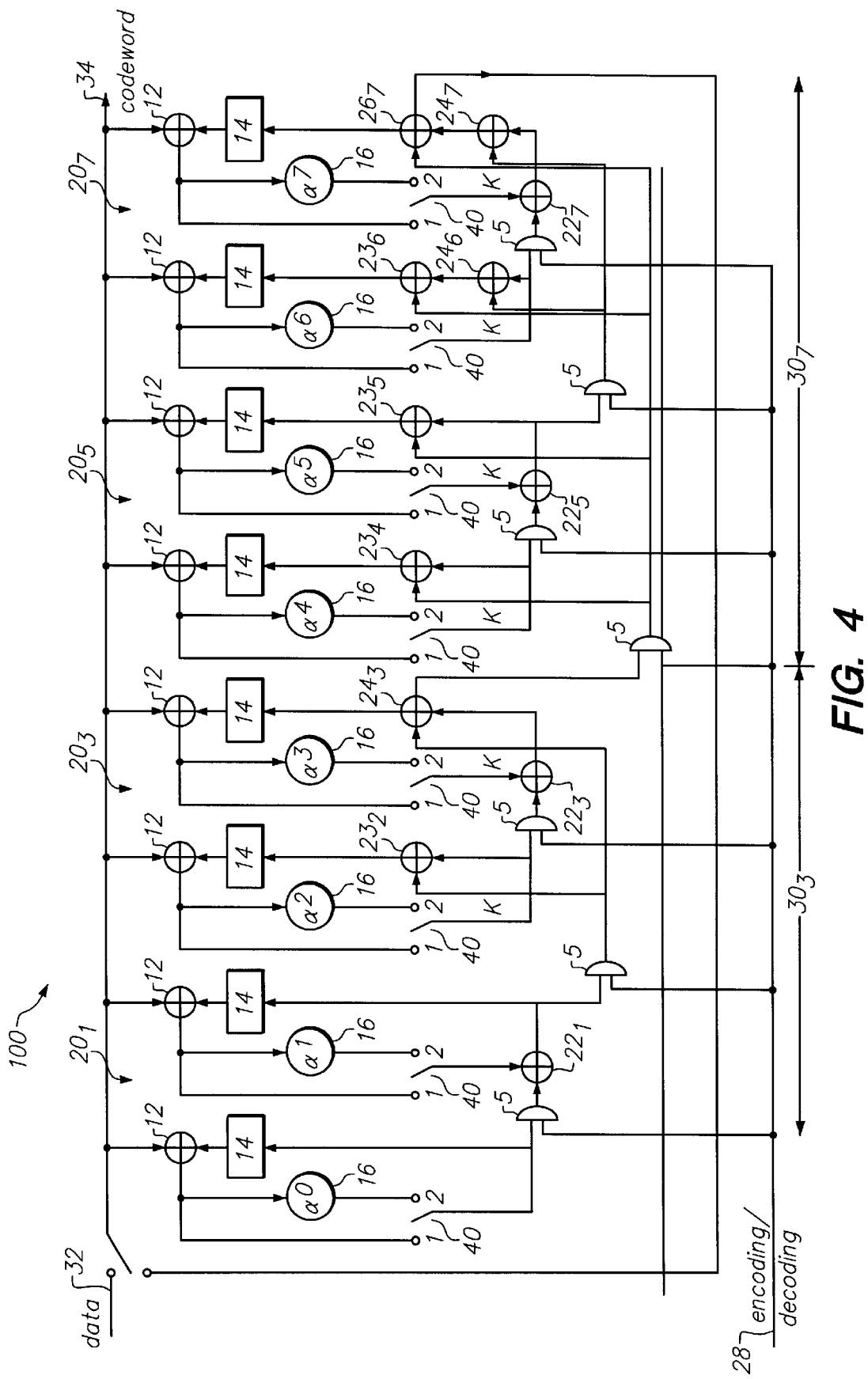
FIG. 4 is a functional block diagram of a multiple-block system that produces eight redundancy symbols.
Figure 5:
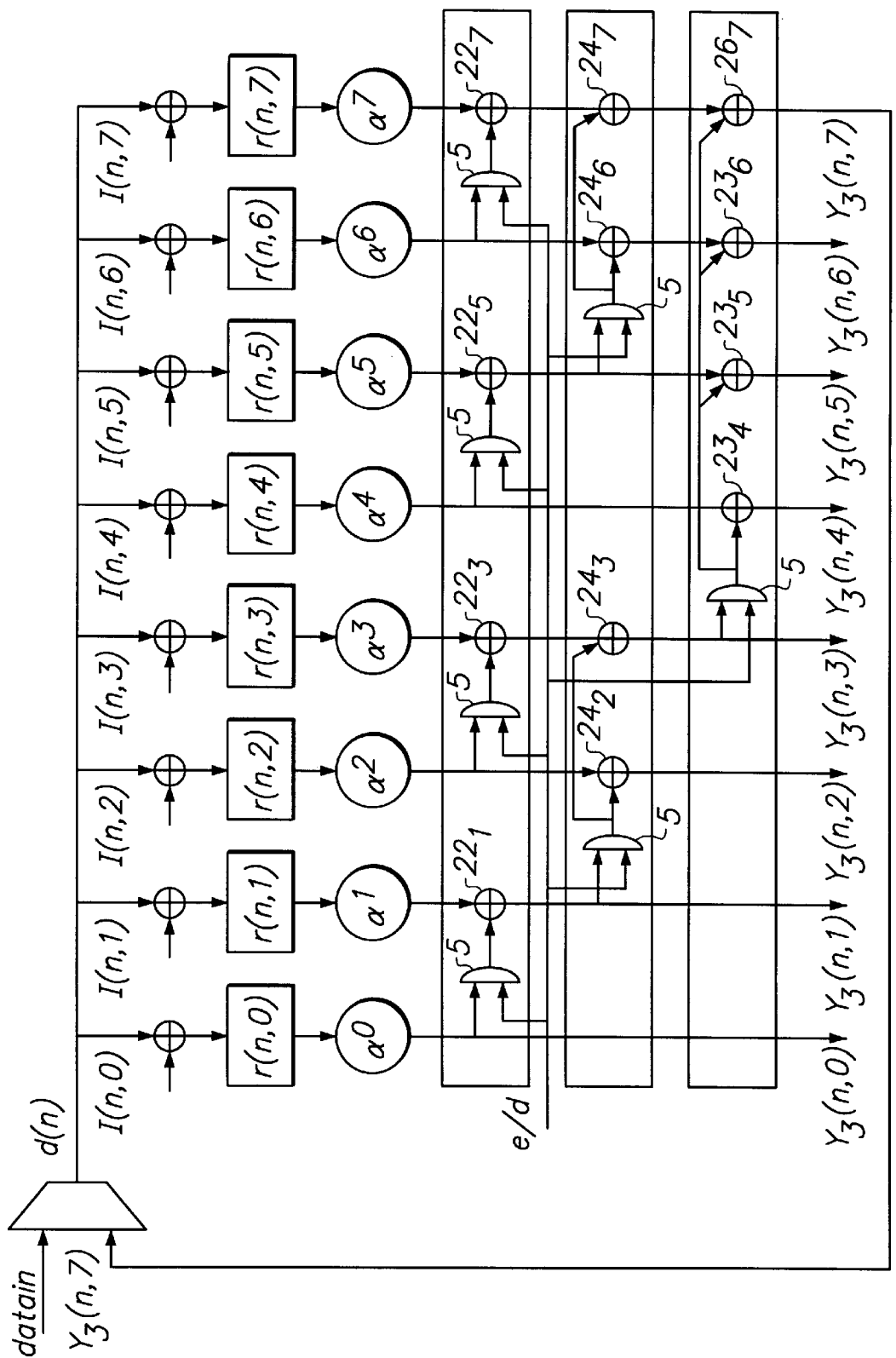
FIG. 5 is a functional block diagram of the system of FIG. 4 with an alternative cell.

To reduce the delay, a combined encoding/syndrome generating system 100 discussed below with reference to FIGS. 4 and 5 is segmented into a plurality of multiple-cell blocks 20 that operate in parallel to produce interim sums. The interim sums are then combined, to produce the propagating sum. With the cells and blocks operating in parallel, the time associated with propagating the sum across the system is significantly reduced.

Figure 2:
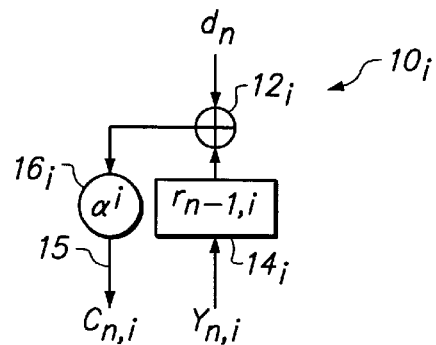
FIG. 2 is a functional block diagram of a cell.

Referring to FIG. 2, an $i^{th}$ cell $10_i$ of the system 100 depicted in FIGS. 4 and 5 includes an update adder $12_i$ that in the $n^{th}$ time period adds a data symbol $d_n$ to the contents $r_{n-1,i}$ of an associated register $14_i$. The result is multiplied by the $i^{th}$ root of the generator polynomial in a Galois Field multiplier 16 to produce, on line 15, the cell output signal $$C_{n,i}=(r_{n-1,i}+d_n)* a^i.$$

Figure 3:
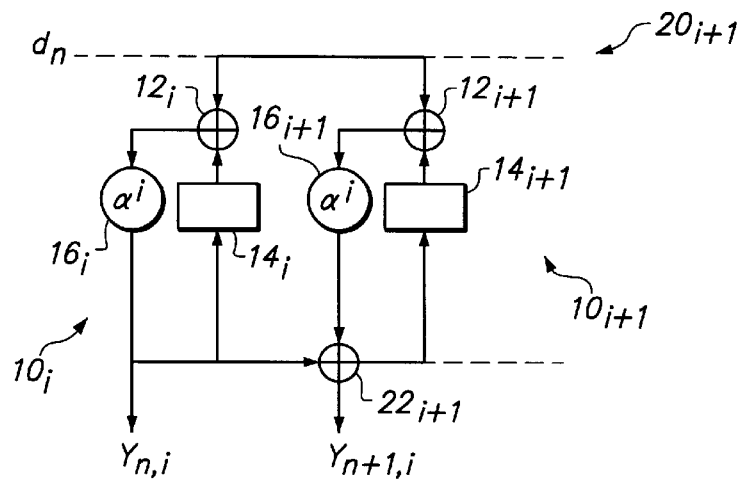
FIG. 3 is a functional block diagram of a two-cell block.

Referring also to FIG. 3, a block $20_{i+1}$ includes two cells $10_i$ and $10_{i+1}$ and a block feedback adder $22_{i+1}$ that produces the associated interim sum $$B_{n,i+1} = C_{n,i} + C_{n,i+l} =$$
$$a^i * (r_{n-l,i} + d_n + a^{i+1}) * (r_{n-l,i+l} + d_n) = \sum_{k=0}^{l} a^{i+k} * (r_{n-1,j+k} + d_n).$$

For convenience, the block 20 and block feedback adder 22 are referenced by the index number of the last cell in the block.

Multiple blocks 20 operate together as a group 30, which can also be thought of as a larger block. A two-block group $30_{i+3}$ includes a feedback adder $24_{i+3}$ that adds together the respective sums produced by the two blocks and produces the associated interim sum. A feedback adder 26 adds the interim sum into the propagating sum from the previous group and passes the result to the next group, and so forth Each group also includes one or more intermediate feedback adders 23 that operate in parallel with the feedback adder 26, to add the interim sum from the preceding group into the products produced by the respective cells 10. The sums $I_{n,i}$ produced by the intermediate feedback adders 23 are then fed back to update the associated registers $14_i$ such that $r_{n,i}=I_{n,i}$. The update sum $I_{n,i}$ supplied to a given register $14_i$ in the second block in the group thus incorporates the products produced by all the previous cells in the system, including the cells in the first block in the group.

In general, a group that includes m blocks that each have two cells produces the interim sum:

$$M_{n,i+2m-1} = B_{n,i+1} + B_{n,i+3} + \ldots + B_{n,i+2m-1} =$$

$$\sum_{k=0}^{1} \alpha^{i+k} * (r_{n-1,i+k} + d_n) + \sum_{k=2}^{3} \alpha^{i+k} * (r_{n-1,i+k} + d_n) + \ldots +$$

$$\sum_{k=2m-3}^{2m-1} \alpha^{i+k} * (r_{n-1,i+k} + d_n) = \sum_{k=0}^{2m-1} \alpha^{i+k} * (r_{n-1,i+k} + d_n)$$

which is the equivalent of propagating sum set forth in eqn. 3.

As shown in FIG. 4, a system 100 for producing eight redundancy symbols includes four two-cell blocks 20₁, 20₃, 20₅ and 20₇. The four blocks operate in parallel to produce at the block feedback adders 22₁, 22₃, 22₅ and 22₇ a set of four sums $B_{n,i}$. The blocks 20₁ and 20₃, and the blocks 20₅ and 20₇ are grouped and operate, respectively, in parallel as groups 30₃ and 30₇ to produce interim sums in feedback adders 24₃ and 24₇. A propagating sum feedback adder 26₇ then combines the interim sums to propagate a sum from the first cell through the last cell in the system.

The delay through the system is the time associated with producing the sums $B_{n,i}$ in parallel, adding the sums in parallel to produce the interim sums, and combining the interim sums to produce the propagating sum. The delay is thus the time to propagate through three XOR gates.

As discussed, the various interim sums are selectively supplied in parallel to the intermediate feedback adders 23ᵢ in a next block or group and are included in the sums $I_{n,i}$ that update the associated registers 14ᵢ in the various cells 10ᵢ.

More specifically, the sum $B_{n,1}$ produced by the feedback adder 22₁, in the first block 20₁ is combined in a feedback adder 24₃ with the sum $B_{n,3}$ produced simultaneously by the second block. The result is the interim sum $M_{n,3}$:

$$M_{n,3} = B_{n,1} + B_{n,3} = \sum_{k=0}^{1} \alpha^k * (r_{n-1,i+k} + d_n) + \sum_{k=2}^{3} \alpha^{i+k} * (r_{n-1,i+k} + d_n) =$$

$$\sum_{k=0}^{3} \alpha^{i+k} * (r_{n-1,i+k} d_n)$$

which is propagated to the next group 30ᵢ₊₇, and also fed back to update the register 14₃ of the last cell 10₃ in the group. At the same time the sum $B_{n,1}$ is supplied to the intermediate feedback adder 23₂ which includes the sum in the update value that is fed back to the associated register 14₂. Each cell in the second block is thus appropriately updated with the contributions from all of the previous cells.

The third and fourth blocks 20₅ and 20₇, which operate in parallel with the first and second blocks, produce the sums $B_{n,5}$ and $B_{n,7}$. These sums are combined, in the feedback adder 24₇, to produce the associated interim sum $M_{n,7}$. The interim sum is then combined, in the feedback adder 26₇, with the interim sum produced by the first group to propagate a sum from the first cell through the last cell 10₇. Also, the interim sum produced in the first group is simultaneously supplied to intermediate feedback adders 23₄, 23₅ and 23₆, such that the products produced by each of the previous cells are included in the update signals that are fed back to the associated registers 14₄, 14₅ and 14₆.

After all of the data symbols have been supplied to the system and the associated sums propagated through the system, a switch 30 is repositioned to pass the sum produced by the feedback adder 26₇ to the update adders 12ᵢ. The system is then clocked j−1 more times, with the switch 30 in the same position, to produce the j redundancy symbols.

While the data symbols are supplied to the system, a switch 32 passes the data symbols to an output line 34. Thereafter, the switch 32 is repositioned to pass the redundancy symbols to the output line 34 during the next j−1 clock cycles.

The latency of the system 100 is the delay associated with passing through the various "layers" of corresponding feedback adders. In a first layer, the system operates the feedback adders 22ᵢ in parallel to combine the products produced by the individual cells, such that the associated delay is the time it takes to pass through a single XOR gate. The sums then are simultaneously supplied to a second layer that contains the feedback adders 24ᵢ. These adders also operate in parallel to combine the sums produced by the first layer of feedback adders and produce a next set of sums. The associated delay through the second layer is again the time it takes to pass through a single XOR gate. The set of sums produced by the feedback adders 24ᵢ is the set of interim sums. In a third layer, the feedback adder 26₇ combines the interim sums through a single XOR gate, to propagate a sum from the first cell 10₀ through the last cell 10₇. There are thus three layers in a system that produces 8 ECC symbols, and the associated latency is the delay through three XOR gates. This is in contrast to the conventional Fettweis-Hassner system, which produces 8 ECC symbols with a latency associated with the delay through a chain of seven XOR gates.

In systems that produce more than 8 ECC symbols, the blocks are arranged into larger groups of blocks that operate in parallel, such that a sum propagates through the system from one group to another. In such systems, the latency is essentially the delay through the constituent blocks or groups.

For example, a system that contains sixteen cells operates as two eight-cell groups. Each group operates as four two-cell blocks with the eight constituent cells operating in parallel to produce the products that are combined, also in parallel, to produce the associated four block sums. The block sums are thus produced with a delay associated with passing through a single XOR gate. The four block sums are then combined in parallel into two larger-block sums, again with a delay through a single XOR gate. Next, the two larger-block sums are combined to produce the interim sum for the group with a delay through another single XOR gate. The associated delay through the group is thus the delay associated with passing through three XOR gates.

The interim sums produced in parallel in the two groups are then combined to produce the propagating sum, with a delay associated with passing through one more XOR gate. The total delay through a system that produces 16 ECC symbols is thus the delay associated with four XOR gates. In general, the delay through a system of L cells is the time to propagate through $\log_2 L$ XOR gates.

As discussed above, the system 100 requires more XOR gates, or adders, than the conventional system. The total number of feedback adders required to produce the propagating sum in an eight cell system is 12, one for each of the four two-cell blocks, two more to combine the results for each pair of blocks into the two interim sums, one to combine the interim sums into the propagating sum, and 5 intermediate feedback adders to include the interim sums in the update values for the various cells of the second, third and fourth two-cell blocks. In addition, the system includes an update adder in each of the eight cells, for a total of 20 XOR gates. If the system includes two eight-cell groups, that is, sixteen cells, the system includes a total of 48 gates, twenty for the first group of eight cells, twenty seven for the second group of eight cells and one to combine the interim sums produced by the two groups. The extra seven adders in the second group are the intermediate feedback adders that add the interim sum produced by the first group into the update values produced by each cell in the second group.

In general, the total number of XOR gates required in a system 100, that is, the total the number of update and feedback adders, is based on the number of cells in a system. For a system with $2^L$ cells, the total number of XOR gates is:

$$N=(L+2)*2^{L-1}.$$

Accordingly, for the system that produces eight redundancy symbols, and thus, has $8=2^3$ cells, the total number of XOR gates is $(3+2)2^2=20$, as set forth above. A conventional Fettweis-Hassner circuit that produces eight redundancy symbols has a total of 8 update adders and 7 feedback adders or 15 XOR gates. The circuit 100 depicted in FIG. 4 thus has an additional 5 XOR gates. The delay associated with propagating a sum across the system 100 is, however, reduced from the delay of passing through a chain of 7 XOR gates in the conventional system to that of passing through a chain of $\log_2$ XOR gates, or 3 XOR gates.

More generally, for systems in which the number of cells is not a power of 2, that is, the number of redundancy symbols $R \neq 2^L$, the number of XOR gates is determined by the formula:

$$N = \sum_{i=0}^{S} [L_i + 2(S+1-1)]2^{L_i-1}$$

where $L_S = \lfloor \log_2 R \rfloor$ and $R = 2^{L_S} + 2^{L_{S-1}} + \ldots + 2^{L_0}$ with $L_S > L_{S-1} \ldots > L_0$. For example, a system that produces 36 redundancy symbols, with $R=2^5+2^2$ and S=1, requires N XOR gates where:

$$N = \sum_{i=0}^{1} [L_i + 2(1+1-i)]2^{L_i-1} = [2+2(1+1-0)]2^{2-1} + [5+2(1+1-1)]2^{5-1} = 124$$

The system produces the redundancy symbols with a delay through $L_S+1$ or 6 XOR gates. In contrast, a conventional system produces the redundancy symbols using 71 XOR gates and has a delay through R−1 or 35 XOR gates.

When the system 100 is used for syndrome generation, the AND gates 5 are deactivated by deasserting the signal on line 28. The cells 10 then operate independently to produce the associated syndromes. A by-pass switch 40 may be included in each cell, directly to the associated feedback adder 22$_i$, and thus, directly to the associated the register 14$_i$, rather than to the Galois Field multiplier. The registers 14$_i$ then contain the error syndromes $S_i$, which are used in a conventional manner to determine the error locations.

If the by-pass switches 40 are not included in the system 100, the system produces modified error syndromes, $\alpha^i S_i$. As discussed below with reference to FIG. 7, we have developed a decoding system that uses the modified error syndromes directly to determine the error locations. The decoding system of FIG. 7 is more complicated than the conventional decoding system, and there is thus a trade-off between encoder and decoder complexity.

Figure 6:
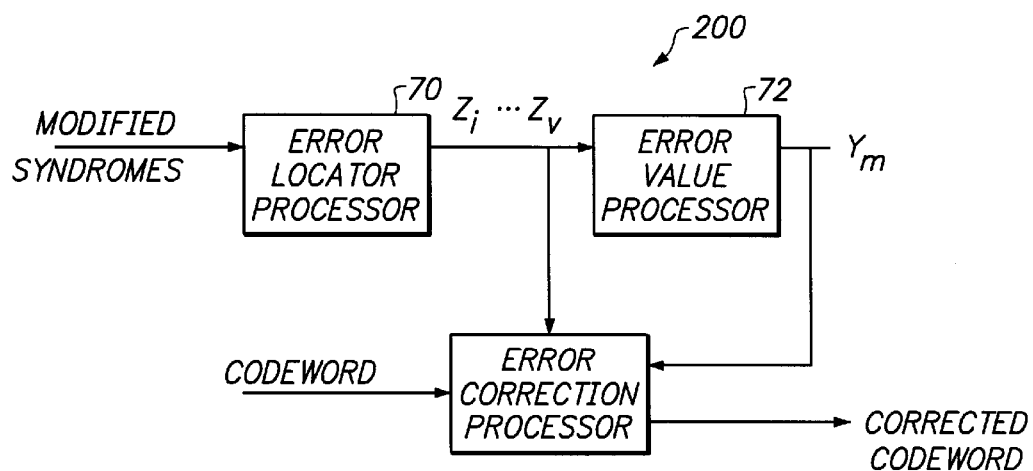
FIG. 6 is a finctional block diagram of a decoding system for use with a modified version of the system of FIG. 4.

Referring now to FIG. 6, an alternative system 101 includes cells in which the register 14$_i$ is positioned between the update adder 12$_i$ and the Galois Field multiplier 16. In this system, the data is added to the feedback signal $I_{n,i}$ and the result is then used to update the register. The register thus contains the sum $$r_{n,i}=I_{n-1,i}+d_n=Y_{n-1,i}+d_n$$

where $Y_{n-1,i}$ is the propagating sum from the previous clock cycle. The Galois Field multiplier, in a next clock cycle, multiplies the contents of the register by a root of the generator polynomial and provides the product $\alpha^{i*}(Y_{n-1,i}+d_n)$ to the associated feedback adder 22$_i$. Accordingly, feedback adder produces the result:

$$Y_{n,i} = \sum_{k=0}^{i} \alpha^{i+k} * (Y_{n-1,i+k} + d_n)$$

which again is the same result as eqn. 3.

The system 101 has the same reduced latency during encoding operations as the system 100. During syndrome generation, the registers contain the actual error syndromes and not the modified syndromes discussed above, since the data symbol is included directly in the updated register. Accordingly, the system may be used in conjunction with a conventional decoding system, without requiring the by-pass switches 40 (FIG. 4).

B. Decoding Operations

For a finite field $GF(2^m)$ and a Reed-Solomon ECC of length n with generator polynomial $g(x)=(x-\alpha^L)(x-\alpha^{L+1}) \ldots (x-2^{L+2r})$, the code word has locations $\alpha^i, \alpha^1 \ldots \alpha^{n-1}$. A code word for decoding is c+e, where c is the error-free code word and e represents the errors. If there are v errors at locations $X_0, X_2 \ldots X_{v-1}$ with corresponding error values $Y_0, Y_1 \ldots Y_{v-1}$, the actual error syndromes are $$S_i = \sum_{j=1}^{v} Y_j X_j^{L+i-1}$$

The error syndromes can be computed, as discussed above, from the codeword c+e.

An error location polynomial $$\sigma(x) = \prod_{i=0}^{v-1} (1 - x_i x)$$

can also be determined in a known manner from the error syndromes $S_i$, using, for example, the well-known Berlekamp-Massey or Euclidean decoding algorithms, and $$S_{j+v-1}+\sigma_1 S_{j+v-2}+ \ldots \sigma_{v-1} S_j = 0 \text{ for } j=1,2 \ldots v.$$

The error values and error locations can then be calculated in a known manner.

As discussed above, the system 100 produces modified syndromes if the by-pass switches 40 are eliminated. The modified syndromes are:

$$\alpha^{i+L} S_i = T_i \text{ for } i=1,2 \ldots v$$

In the system discussed above L=0, and $T_i = \alpha^i S_i$.

We have determined that a modified error locator polynomial $$A(x) = \sigma(\alpha x) = \prod_{i=1}^{v} (1 - \alpha X_i x)$$

can be calculated from the modified syndromes using the known Berlekamp-Massey or Euclidean decoding algorithms, such that $$T_{j+v-1} + A_1 T_{j+v-2} + \ldots A_{v-1} T_j = 0$$

If $\Omega(x) \equiv A(x)T(x) \mod X^{2t}$, the modified error locations $Z_1, \ldots Zv$ are the roots of $\Omega(x)$ and the error values are $$Y_m = \frac{\Omega(Z_m^{-1})}{Z_m^{-1} A'(Z_m^{-1})} \text{ for } m = 1, 2 \ldots v$$

The modified error locations produced by A(x) are $\alpha Z_1, \alpha Z_2 \ldots \alpha Z_v$, where $Z_1 = \alpha^{i_1} \ldots Z_v = \alpha^{i_v}$. Accordingly, the actual error locations are $\alpha^{i_1+1}, \alpha^{i_2+1} \ldots \alpha^{i_v+1}$, which are shifted one position from the modified error locations calculated from A(x).

Referring now to FIG. 6, the decoding system 200 for use with the modified syndromes includes an error locator processor 70 that determines the modified error locator polynomial A(x) from the modified syndromes $T_i = \alpha^{L-1} S_i$, and then calculates the roots of A(x) to determine the modified error locations. An error value processor 72 uses the modified error locations $Z_1 \ldots Z_v$ to calculate the error values $Y_m$ as discussed above. The error correction processor then determines the actual error locations as $\alpha Z, \ldots \alpha Z_v$ and corrects the erroneous symbols using the calculated error values.

There is thus one extra step for the error correction processor when the modified error syndromes are used. The trade-off for encoder simplicity, that is, the elimination of the by-pass switches 40, is a more complex decoder.

The foregoing description has been limited to a specific embodiment of this invention. It will be apparent, however, that variations and modifications may be made to the invention, with the attainment of some or all of its advantages. Therefore, it is the object of the appended claims to cover all such variations and modifications as come within the true spirit and scope of the invention.

What is claimed is:

1. A system for manipulating data symbols in accordance with the roots of a generator polynomial to produce "j" error correction symbols and j error syndromes, the system including:
   A. j cells that operate in parallel to receive data symbols or propagating feedback sums and producing corresponding update values;
   B. one or more layers of block feedback adders, with the block feedback adders in a given layer operating in parallel, the adders in a first layer adding together the update values produced by adjacent cells and the adders in subsequent layers adding together the sums produced by adjacent block feedback adders, with the adders in a last layer producing at least two interim sums;
   C. an interim feedback adder that adds together the interim sums to propagate a sum from the first cell to the last cell;
   D. a plurality of intermediate feedback adders for adding to the values produced by the cells in a given block the sum produced by the preceding block; and
   E. a switch for providing to the cells either the data symbols or the propagating feedback sum produced by the interim feedback adder.

2. The system of claim 1 further including AND gates between adjacent cells, the AND gates passing the update values from a preceding cell to a next cell during encoding operations and preventing the update values from passing between cells during syndrome generation operations.

3. The system of claim 2, wherein each cell includes:
   a. a Galois Field multiplier associated with a root of the generator polynomial;
   b. a register; and
   c. an update adder.

4. The system of claim 3 wherein:
   the update adder adds the contents of the register to a next data symbol and supplies the result to the Galois Field multiplier, and
   the Galois Field multiplier multiplies the result by a root of the generator polynomial to produce the corresponding update value, and supplies the update value to the register and to the associated block feedback adder.

5. The system of claim 4 wherein each cell further includes a by-pass switch that during encoding operations is in a first position in which the product produced by the Galois Field multiplier is included in the update value, and during syndrome generation operations is in the first position when all but the last data symbol is supplied to the cell and in a second position that by-passes the Galois Field multiplier when the last data symbol in supplied to the cell.

6. The system of claim 3 wherein:
   the update adder adds a next data symbol into an update value for the register and supplies the sum to update the register; and
   the Galois Field multiplier multiplies the updated contents of the register by a root of the generator polynomial to produce the corresponding next update value and supplies the update value to the update adder and to the associated block feedback adder.

7. An error correcting system for encoding data symbols to produce "j" error correction symbols, the system including:
   A. j cells that operate in parallel for receiving data symbols or propagating feedback sums and producing corresponding update values;
   B. one or more layers of block feedback adders, with the block feedback adders in a given layer operating in parallel, the adders in a first layer adding together the update values produced by adjacent cells and in subsequent layers adding together the sums produced by adjacent block feedback adders, with the adders in a last layer producing at least two interim sums;
   C. an interim feedback adder that adds together the interim sums produced by the last layer of block feedback adders and propagates a sum from the first cell to the last cell;
   D. a plurality of intermediate feedback adders for adding to the values produced by the cells in a given block the sum produced by the preceding block;
   E. a plurality of AND gates for passing the update values from a preceding cell to a next cell during encoding operations and preventing the update values from passing during syndrome generation operations; and F. a switch for providing to the cells either the data symbols or the propagating feedback sum produced by the interim feedback adder.

8. The system of claim 7 further including:

a. decoding means for producing a modified error locator polynomial from the syndromes calculated by the cells; and b. error locating means for determining the error locations from the modified error locator polynomial.

9. The system of claim 7 wherein the decoding means produces the modified error locator polynomial as:

$$A(x) = \sigma(ax) = \prod_{i=1}^{v} (1 - \alpha X_i x).$$

10. The system of claim 7 further including error value means for determining the error values as:

$$Y_m = \frac{\Omega(Z_m^{-1})}{Z_m^{-1} A'(Z_m^{-1})} \text{ for } m = 1, 2 \ldots v.$$

11. A method of correcting errors, the method including the steps of:

A. providing data symbols to j cells that operate in parallel;

B. in each cell multiplying a given data symbol by a root of a generator polynomial to produce a corresponding update value;

C. operating in parallel and adding together the update values produced by adjacent cells to produce associated block feedback sums;

D. operating in parallel and combining the block feedback sums to produce new associated block feedback sums;

E. repeating step D until, for a given block, a single feedback sum that includes contributions from all of the cells in the block is produced;

F. operating in parallel and combining the feedback sums from adjacent blocks to produce associated sums;

G. repeating step F until a single propagating sum is produced that includes contributions from all of the cells;

H. supplying the propagating sum in parallel to the cells and producing associated update values;

I. repeating step H j–1 times to produce j error correction symbols; and

J. concatenating the j error correction symbols with the data symbols to produce a data code word.

12. The method of claim 11 farther including the steps of:

K. supplying a data symbol from a data code word to the cells and producing an associated update value in each cell;

L. in each cell combining a next data symbol from the data code word and the update value and producing an associated next update value;

M. repeating step L for each data symbol in the code word;

N. supplying the update values associated with the last data symbol as modified error syndromes;

O. determining a modified error locator polynomial and an error value polynomial from the modified error syndromes;

P. determining modified error locations from the modified error locator polynomial and error values from the error value polynomial;

Q. determining actual error locations from the modified error locations; and

R. correcting errors in the data code word using the error locations and the error values.

13. The method of claim 12 wherein the step of determining a modified error locator polynomial produces the modified error locator polynomial as:

$$A(x) = \sigma(ax) = \prod_{i=1}^{v} (1 - \alpha X_i x).$$

14. The method of claim 12 wherein the step of determining an error value includes determining the error values as:

$$Y_m = \frac{\Omega(Z_m^{-1})}{Z_m^{-1} A'(Z_m^{-1})} \text{ for } m = 1, 2 \ldots v$$

15. The method of claim 11 further including the steps of:

K. supplying a data symbol from a data code word to the cells and producing an associated update value in each cell;

L. in each cell combining a next data symbol from the data code word and the update value and producing an associated next update value;

M. repeating step L for all but the last data symbol in the code word;

N. producing a last update value by combining the next to last update value with the last data symbol;

O. supplying the last update values as the error syndromes;

P. determining an error locator polynomial and an error value polynomial from the error syndromes;

Q. determining the error locations and the error values from the error locator polynomial and the error value polynomial; and R. correcting errors in the data code word using the error locations and the error values.

* * * * *

UNITED STATES PATENT AND TRADEMARK OFFICE
CERTIFICATE OF CORRECTION

| | |
|---|---|
| PATENT NO. | : 6,260,173 B1 |
| DATED | : July 10, 2001 |
| INVENTOR(S) | : Weng et al. |

Page 1 of 1

It is certified that error appears in the above-identified patent and that said Letters Patent is hereby corrected as shown below:

<u>Column 10</u>,
Line 35, replace "in" with -- is --.

<u>Column 11</u>,
Line 52, replace "farther" with -- further --.

Signed and Sealed this

Thirtieth Day of April, 2002

Attest:

*Attesting Officer*

JAMES E. ROGAN
*Director of the United States Patent and Trademark Office*